United States Patent
Bettinelli et al.

(10) Patent No.: US 12,549,129 B2
(45) Date of Patent: Feb. 10, 2026

(54) INTERCONNECTION ELEMENT, PHOTOVOLTAIC STRING AND ASSOCIATED METHODS

(71) Applicants: COMMISSARIAT A L'ENERGIE ATOMIQUE ET AUX ENERGIES ALTERNATIVES, Paris (FR); MONDRAGON ASSEMBLY S COOP, ARETXABALETA (ES); MONDRAGON ASSEMBLY SA, Orange (FR)

(72) Inventors: Armand Bettinelli, Grenoble (FR); Romain Soulas, Grenoble (FR); Gorka Garcia Echevarria, Elorrio Bizkaia (ES); Jean-Philippe Aguerre, Itxassou (FR); Xabier Hernandez Mateo, Izq (ES); Rui Fernandes De Almeida, Orange (FR); Aitor Apraiz Arenaza, Aretxabaleta (ES)

(73) Assignees: COMMISSARIAT A L'ENERGIE ATOMIQUE ET AUX ENERGIES ALTERNATIVES, Paris (FR); MONDRAGON ASSEMBLY S COOP, ARETXABALETA (ES); MONDRAGON ASSEMBLY SA, Orange (FR)

( * ) Notice: Subject to any disclaimer, the term of this patent is extended or adjusted under 35 U.S.C. 154(b) by 0 days.

(21) Appl. No.: 18/333,995

(22) Filed: Jun. 13, 2023

(65) Prior Publication Data
US 2023/0402969 A1    Dec. 14, 2023

(30) Foreign Application Priority Data
Jun. 14, 2022   (FR) ..................................... 2205766

(51) Int. Cl.
H02S 40/36   (2014.01)
H02S 40/34   (2014.01)
H10F 19/90   (2025.01)

(52) U.S. Cl.
CPC .............. H02S 40/36 (2014.12); H02S 40/34 (2014.12); H10F 19/904 (2025.01)

(58) Field of Classification Search
CPC ... H01L 31/058; H10F 19/904; H10F 71/1375
See application file for complete search history.

(56) References Cited

U.S. PATENT DOCUMENTS 6,034,322 A * 3/2000 Pollard .................. B64G 1/443
                                                    136/244
6,359,209 B1 * 3/2002 Glenn .................. H10F 19/904
                                                    257/E27.125

(Continued)

FOREIGN PATENT DOCUMENTS

CN    104576767 A   4/2015
CN    103537496 B   9/2015

(Continued)

OTHER PUBLICATIONS

KR Search Report as issued in French Patent Application No. FR2205766, dated Feb. 7, 2023.

*Primary Examiner* — Golam Mowla
(74) *Attorney, Agent, or Firm* — Pillsbury Winthrop Shaw Pittman LLP

(57) ABSTRACT

An interconnection element extending along a first direction, the interconnection element including first and second ends opposite to each other, and first, second and third portions extending between the first and second ends, the first portion having a first planar surface oriented along a second direction perpendicular to the first direction, the second portion, distant from the first portion and from the second end the second portion having a second planar surface oriented (Continued)

along the second direction, and the third portion, between the first portion and the second portion, and having a circular cross-section.

18 Claims, 12 Drawing Sheets

(56) References Cited

U.S. PATENT DOCUMENTS

| | | | | |
|---|---|---|---|---|
| 8,148,627 | B2 * | 4/2012 | Rose | H10F 19/904 |
| | | | | 136/244 |
| 10,529,881 | B2 * | 1/2020 | Guzie | H10F 19/904 |
| 2007/0079863 | A1 * | 4/2007 | Stan | H10F 19/904 |
| | | | | 136/244 |
| 2013/0025673 | A1 * | 1/2013 | Huebel | H10F 19/904 |
| | | | | 257/E31.124 |
| 2015/0144173 | A1 * | 5/2015 | Hoang | H01L 31/044 |
| | | | | 136/244 |
| 2017/0040479 | A1 * | 2/2017 | Tourino | H10F 19/80 |
| 2017/0236960 | A1 * | 8/2017 | Tourino | H10F 19/80 |
| | | | | 136/256 |
| 2019/0273172 | A1 * | 9/2019 | Guzie | H10F 19/75 |

FOREIGN PATENT DOCUMENTS

| | | | | |
|---|---|---|---|---|
| CN | 112349810 A | | 2/2021 | |
| EP | 3496160 A1 * | | 6/2019 | ......... H01L 31/0504 |
| FR | 3 117 673 B1 | | 4/2023 | |
| KR | 10-2020-0121116 A | | 10/2020 | |
| WO | WO-2009136251 A2 * | | 11/2009 | ........... H01L 31/188 |
| WO | WO 2012/133338 A1 | | 10/2012 | |

* cited by examiner

[Fig. 1]
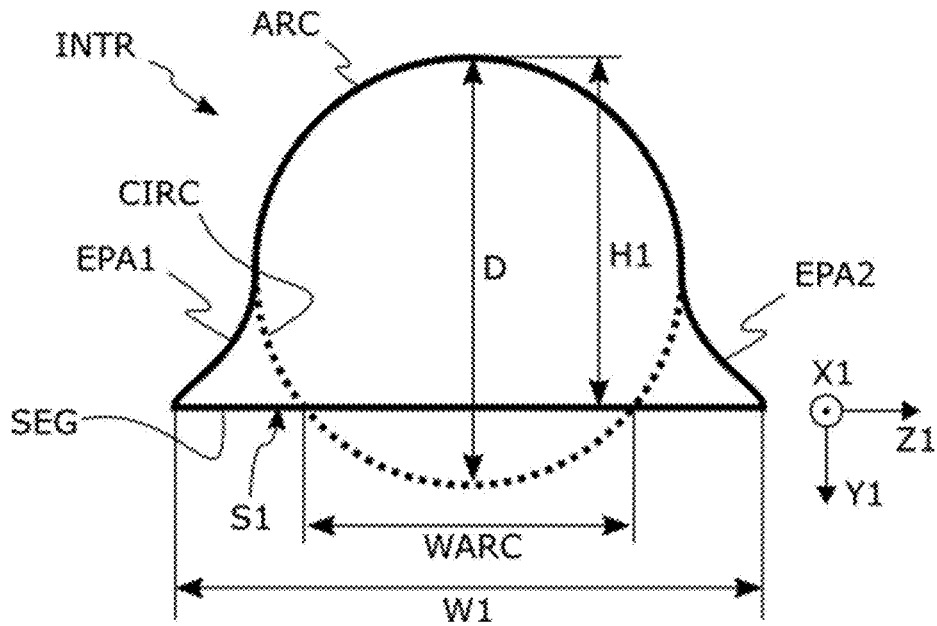
[Fig. 2]
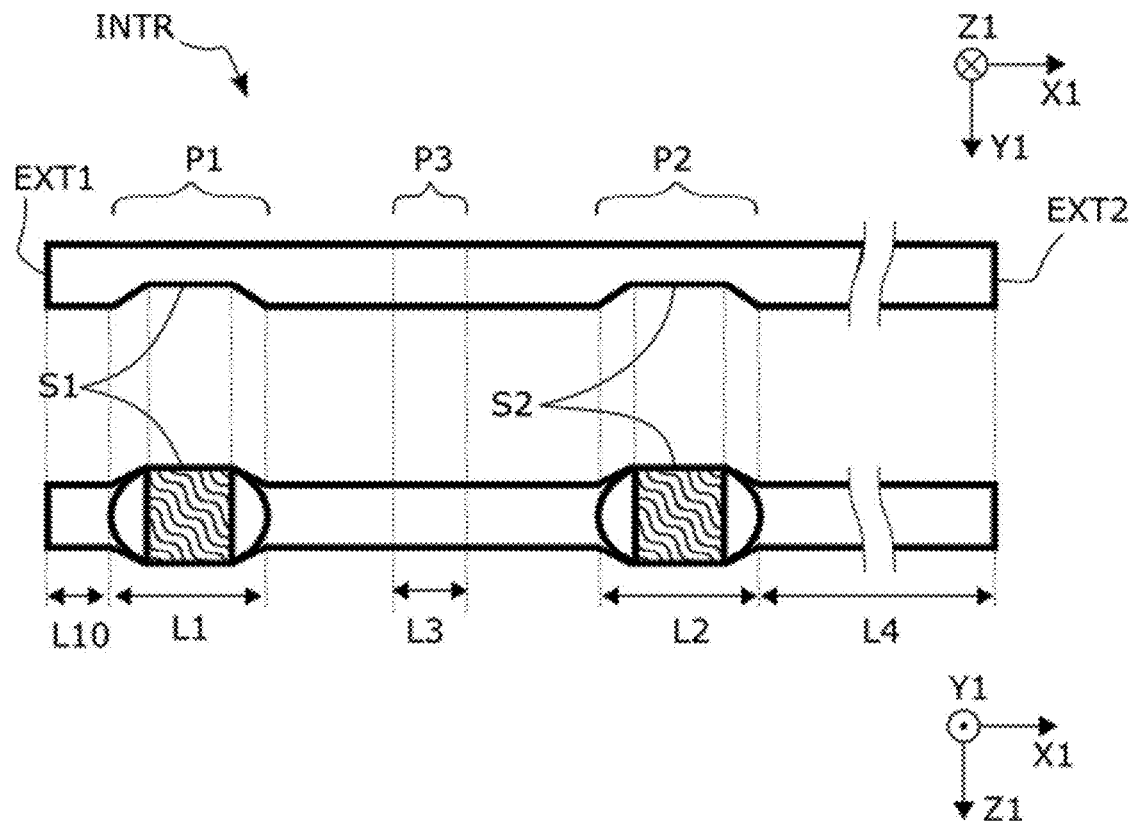

[Fig. 3]
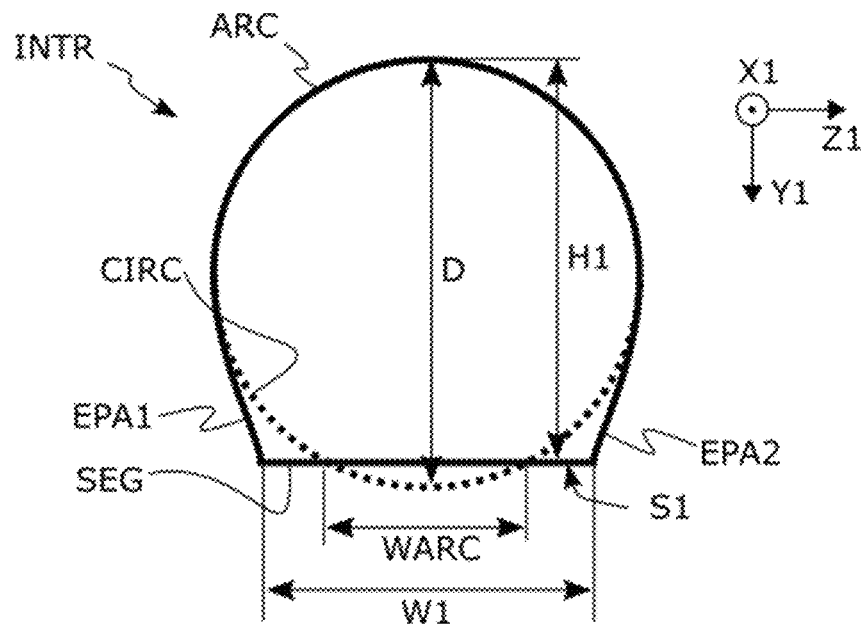
[Fig. 4]
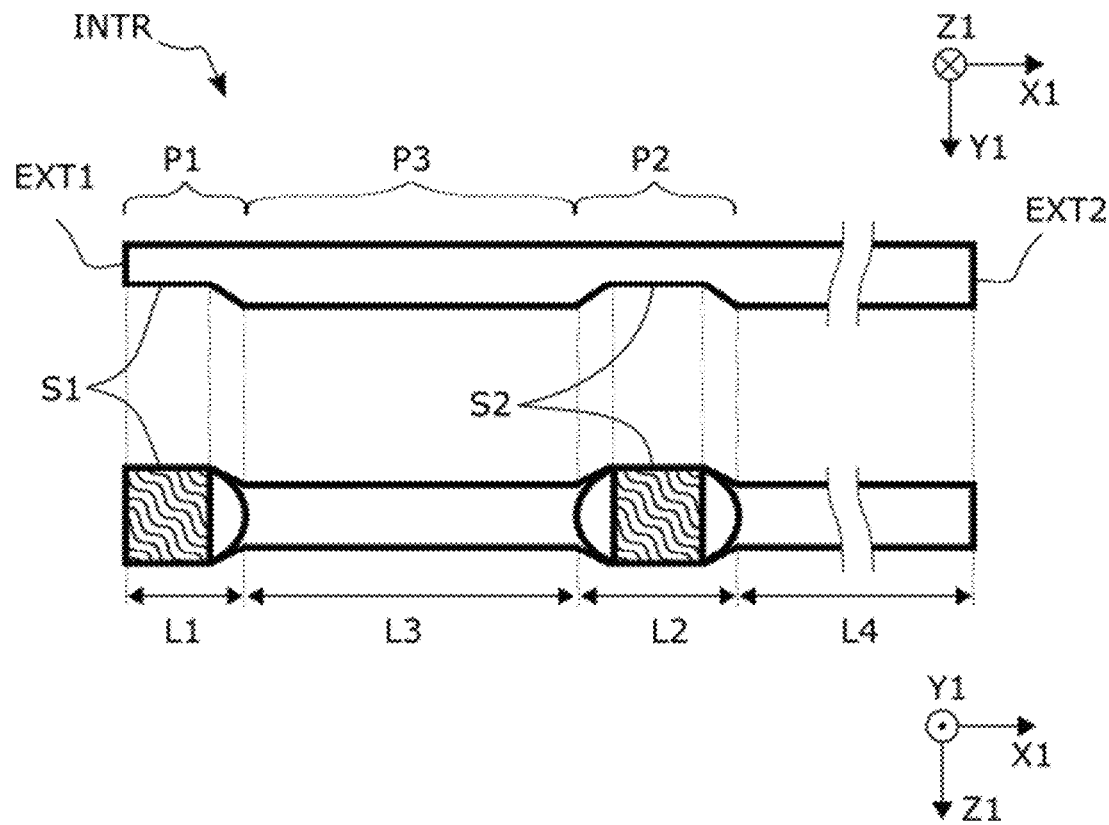

[Fig. 5]
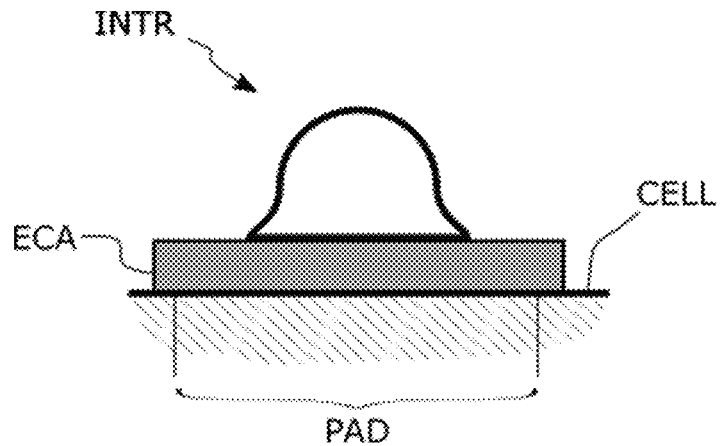
[Fig.6]
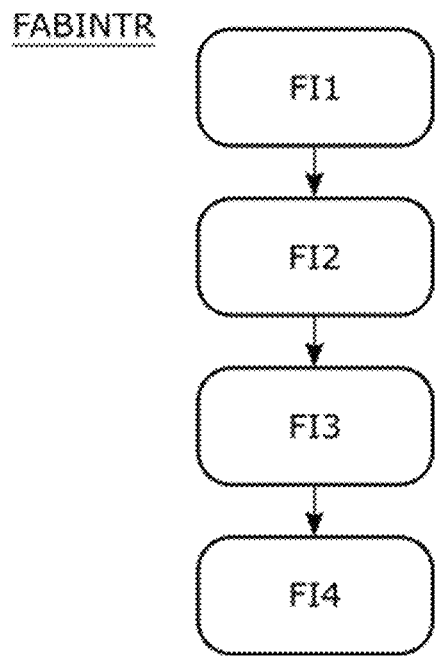

[Fig. 7]
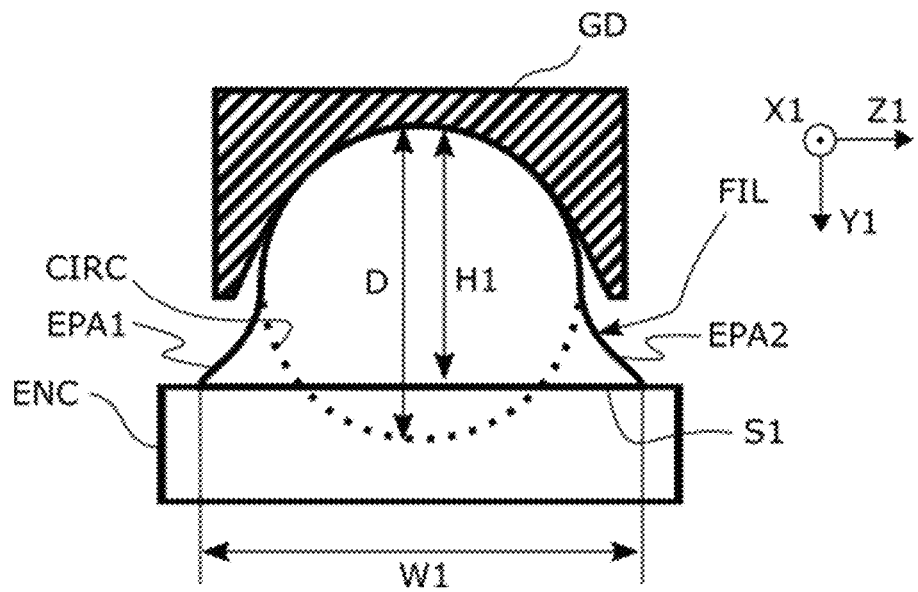
[Fig. 8]
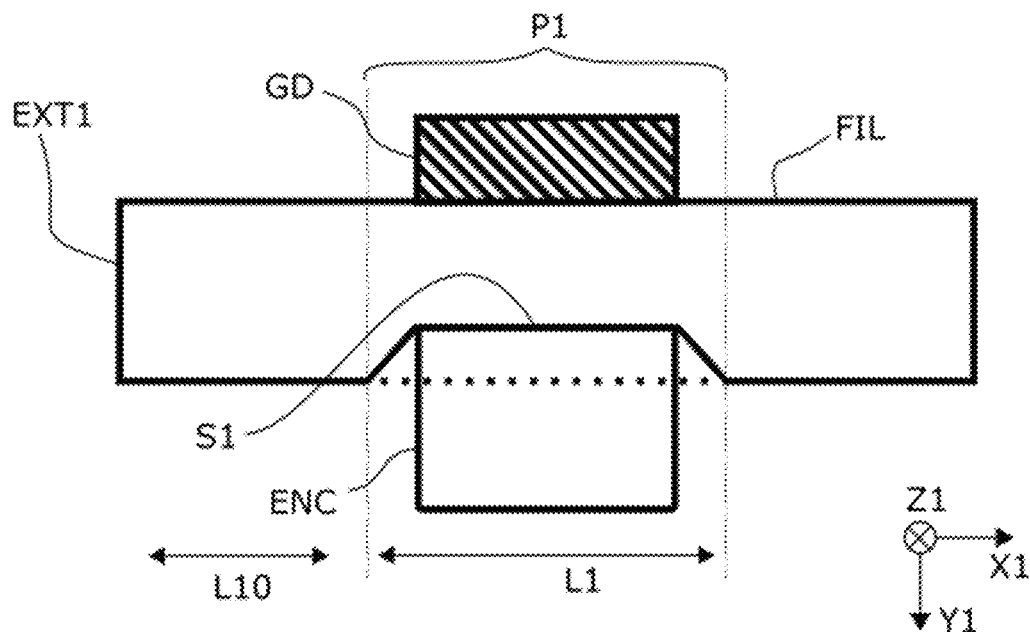

[Fig. 9]
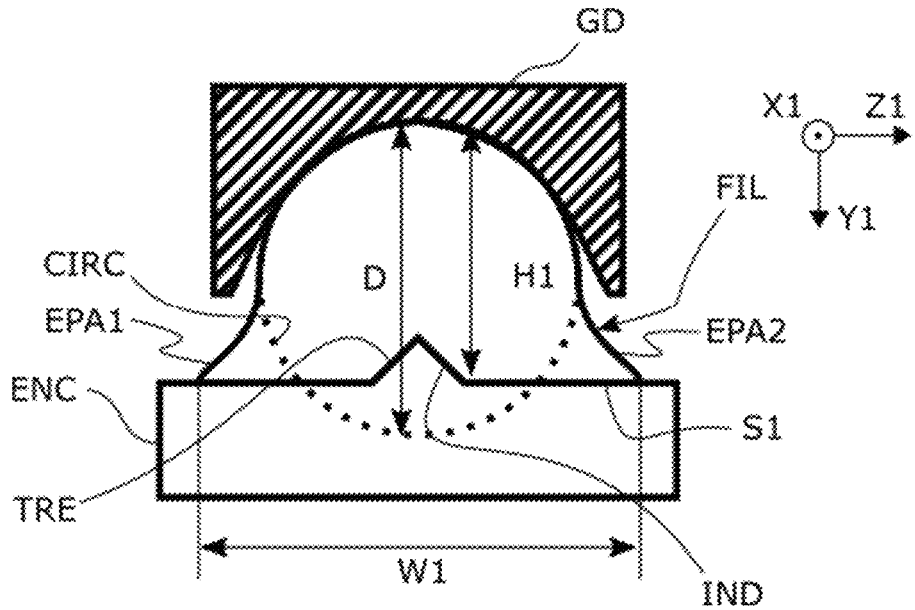
[Fig. 10]
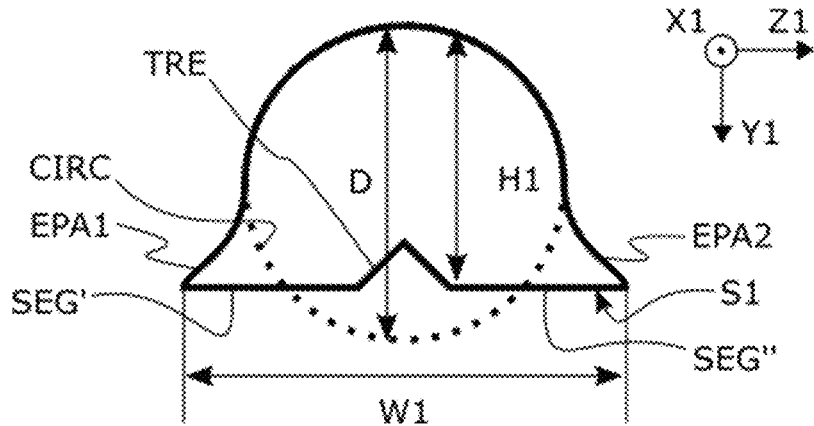
[Fig. 11]
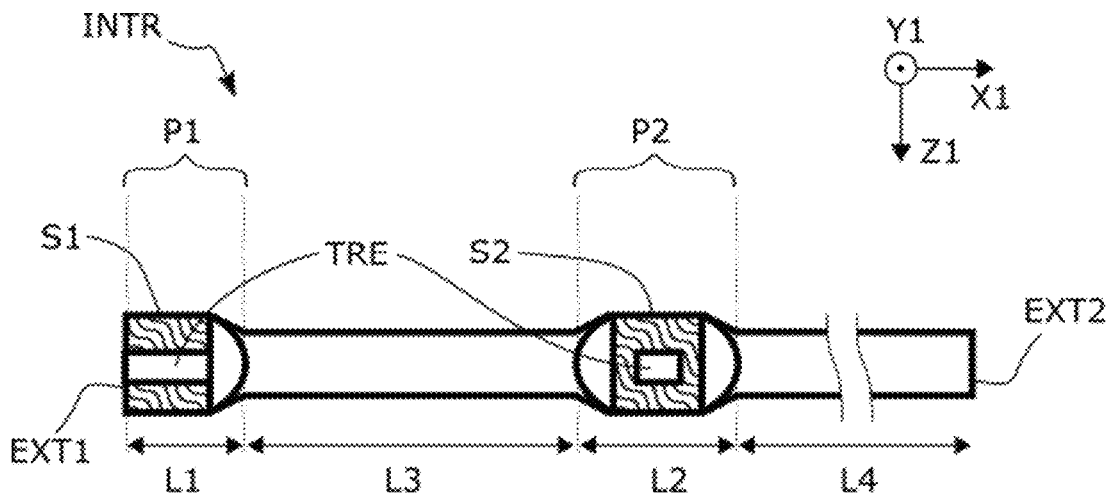

[Fig. 12]
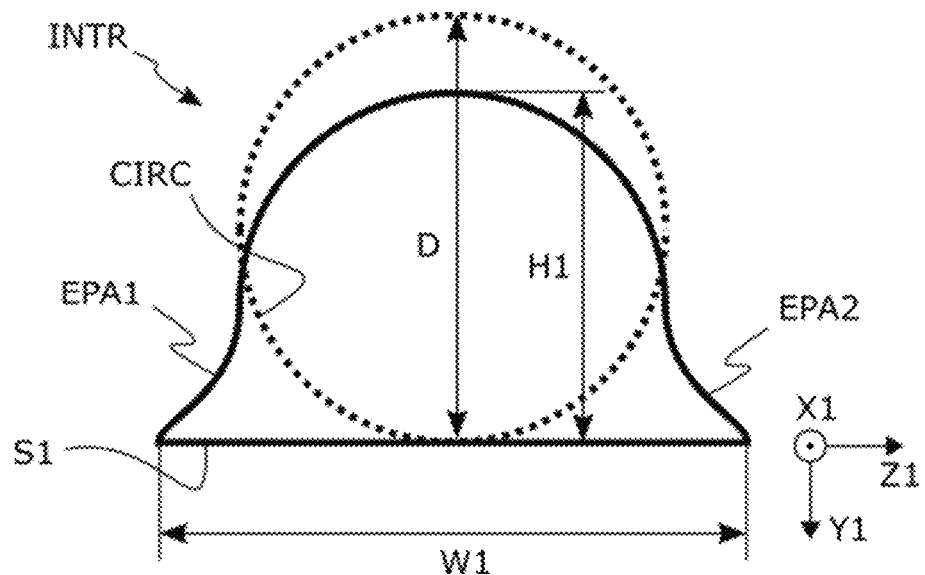
[Fig. 13]
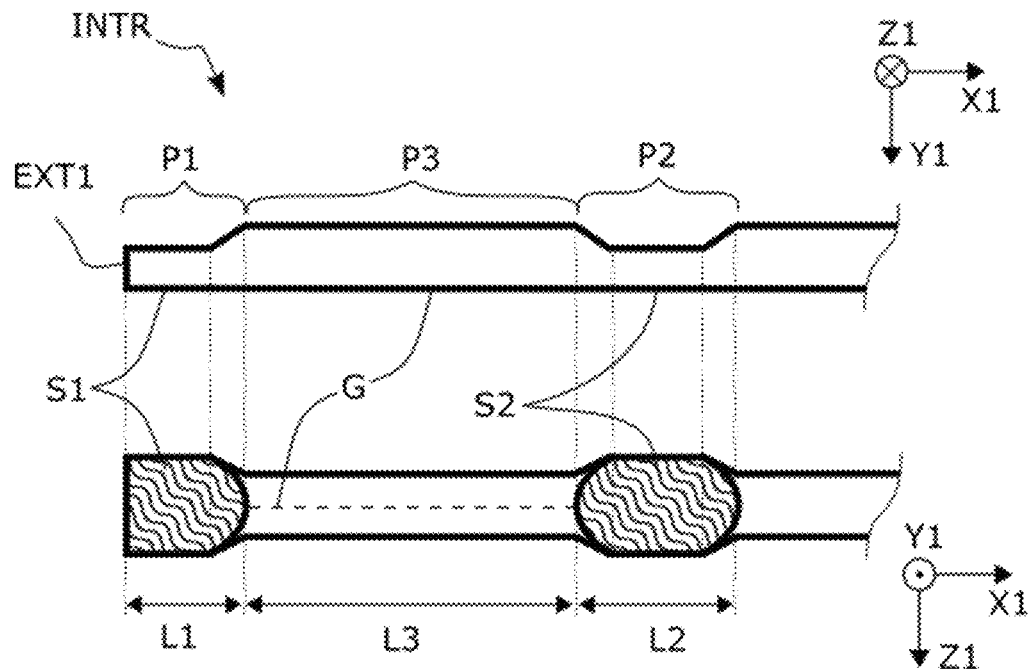

[Fig. 14]
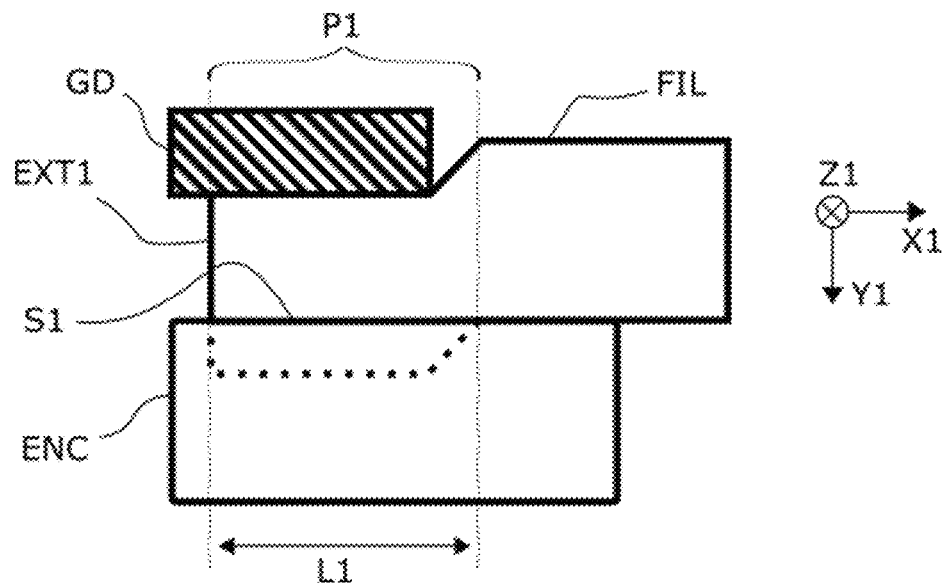
[Fig. 15]
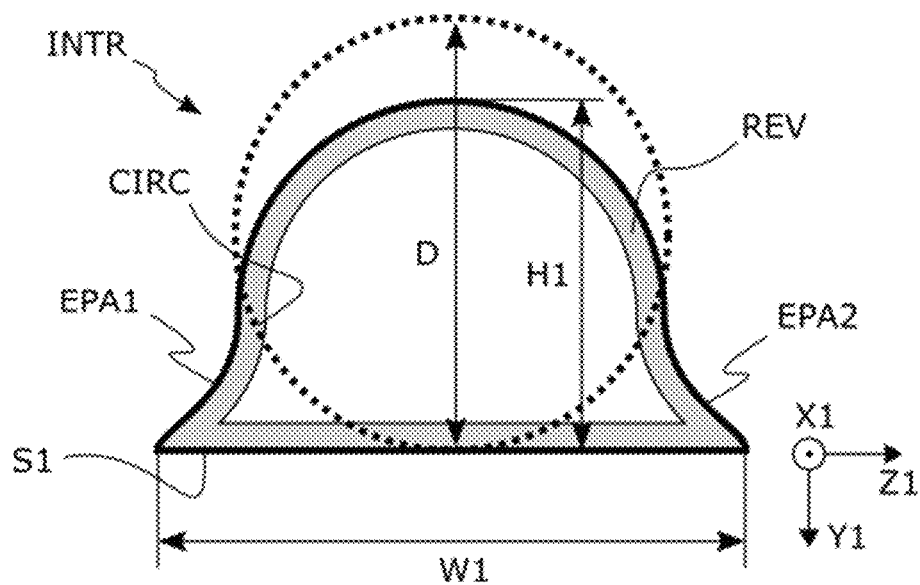

[Fig. 16]
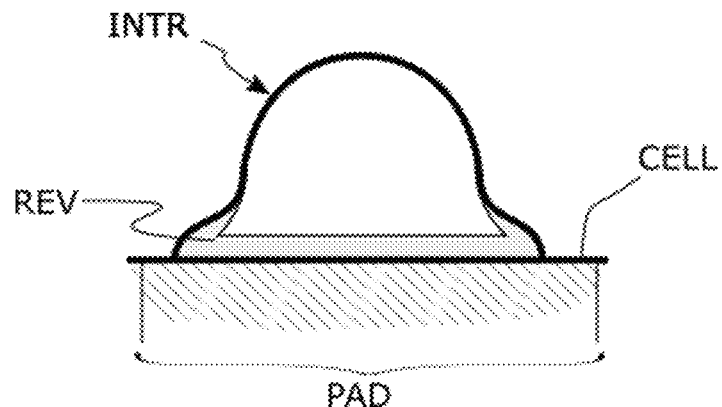
[Fig. 17]
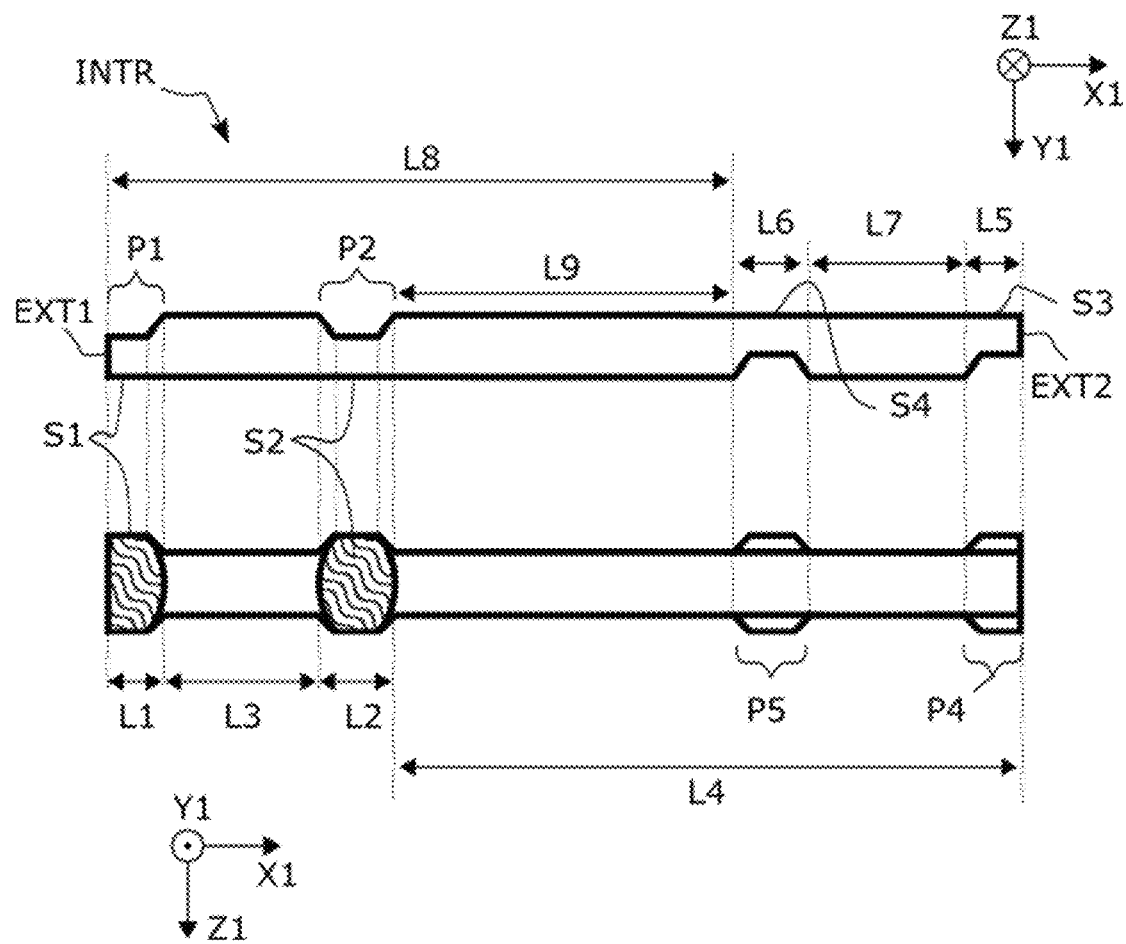

[Fig. 18]
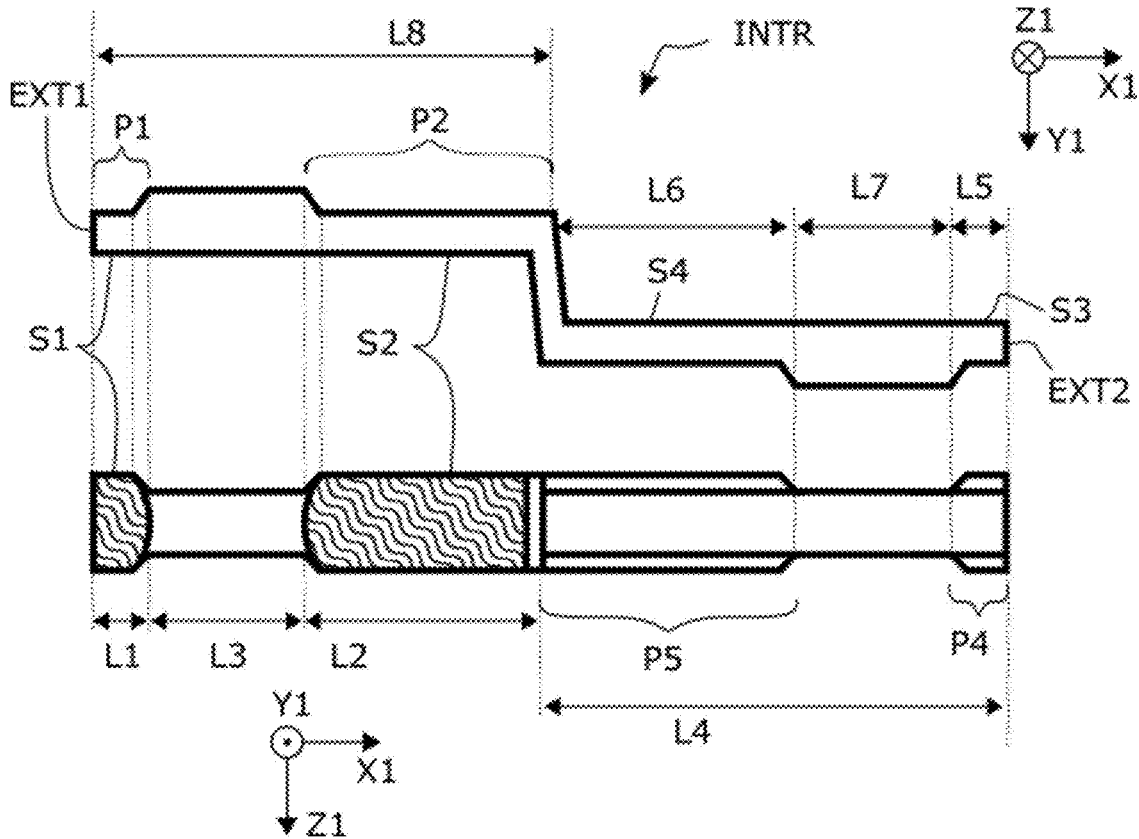
[Fig. 19]
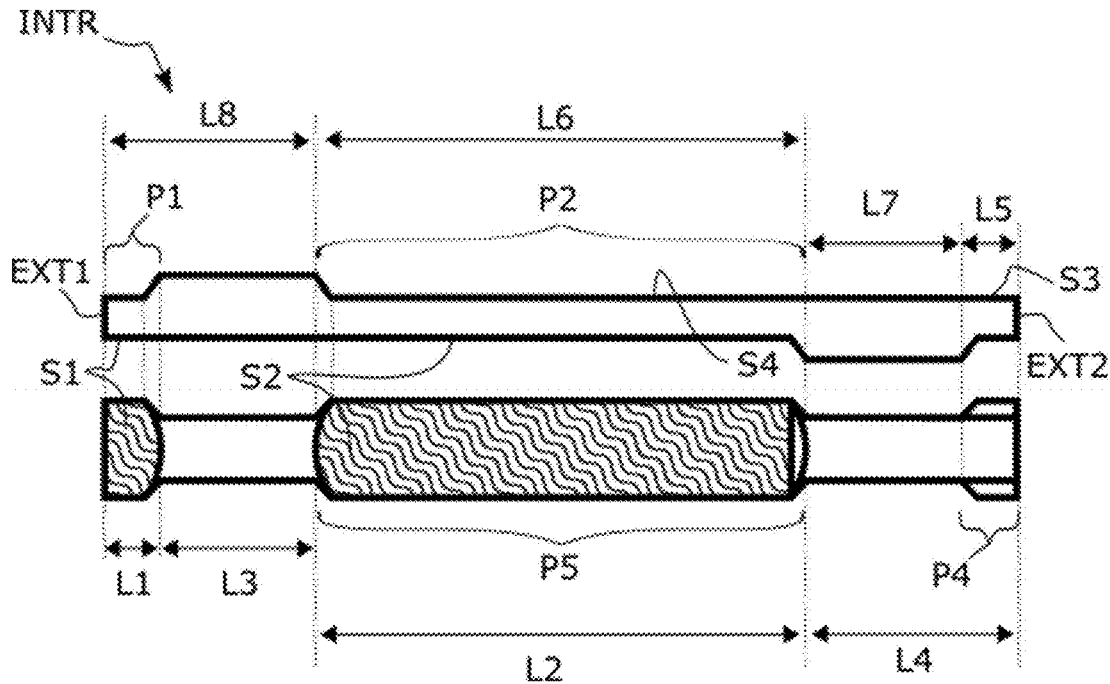

[Fig. 20]
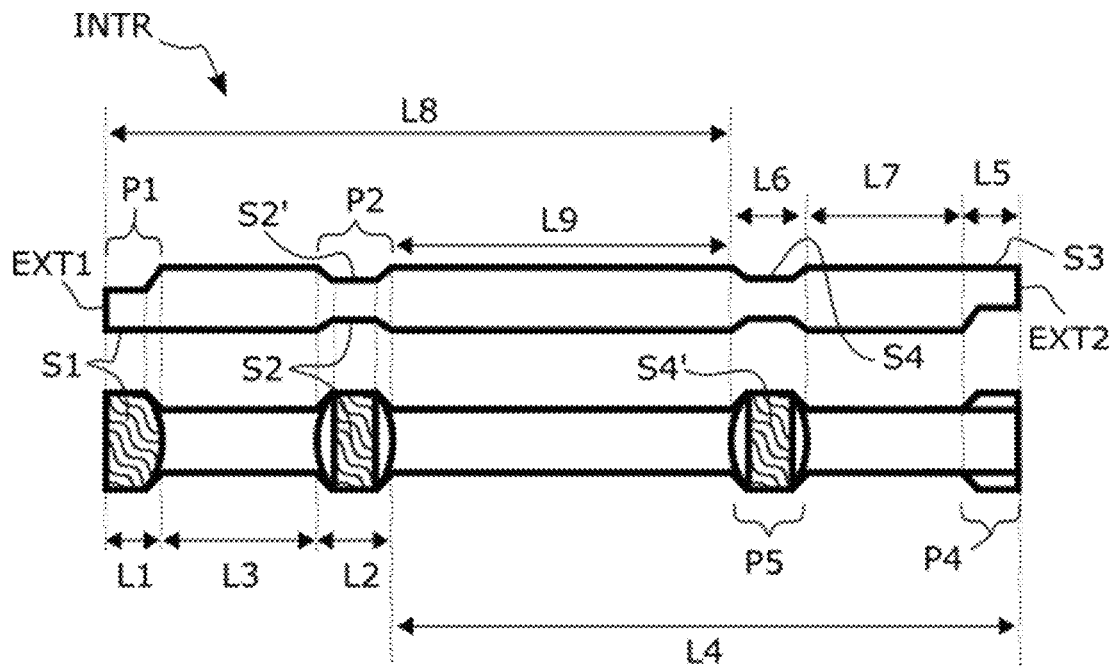
[Fig. 21]
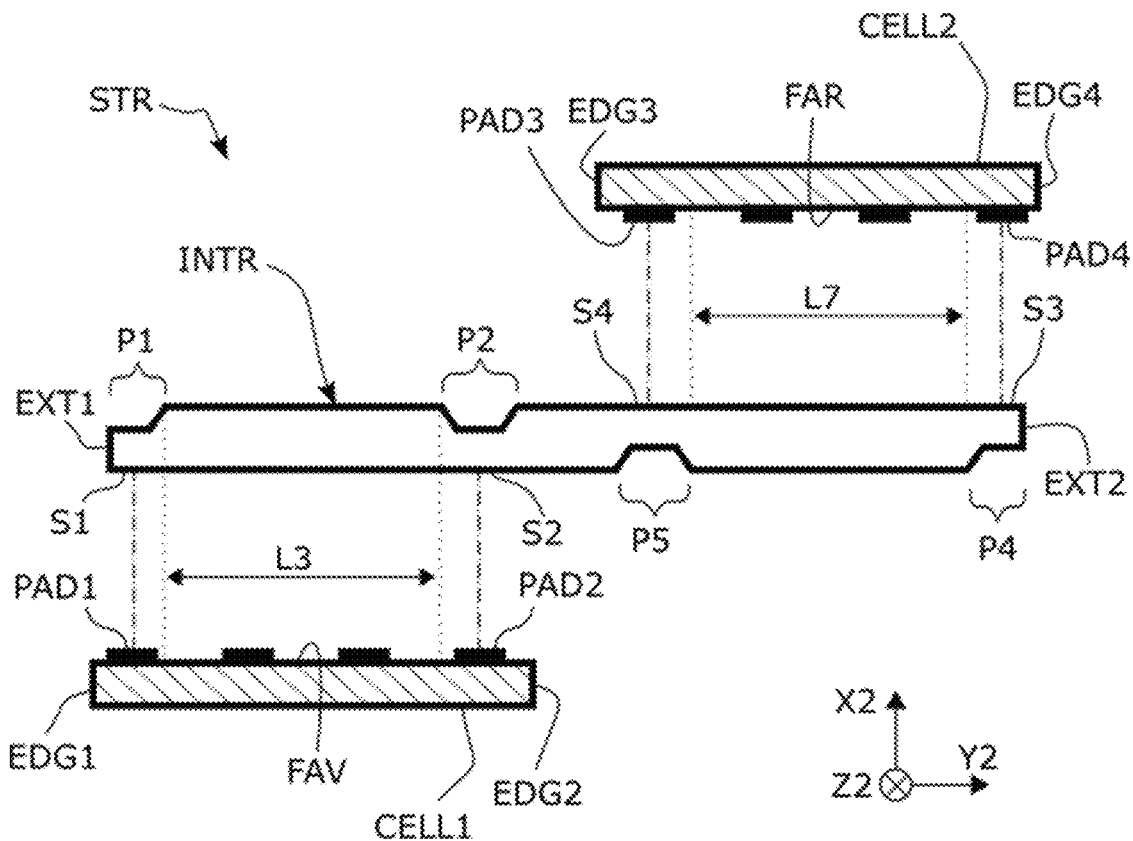

[Fig. 22]
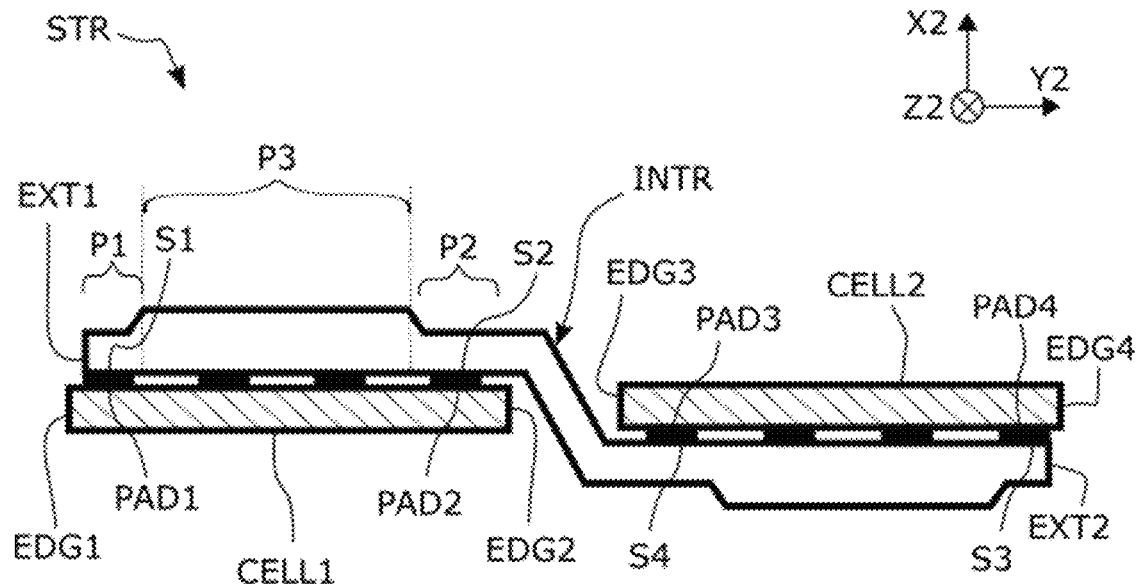
[Fig. 23]
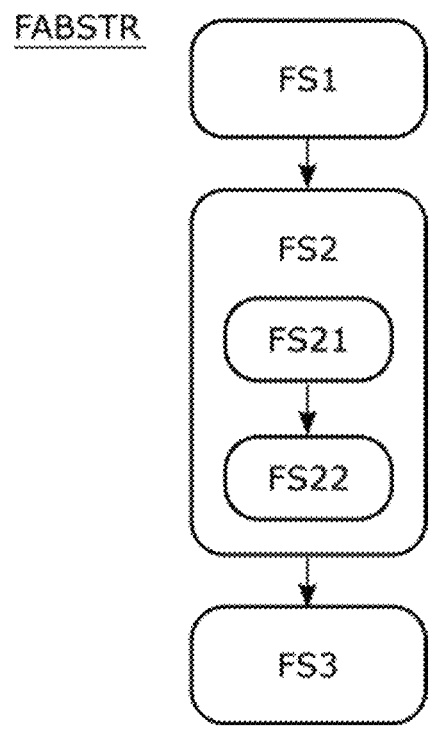

[Fig. 24]
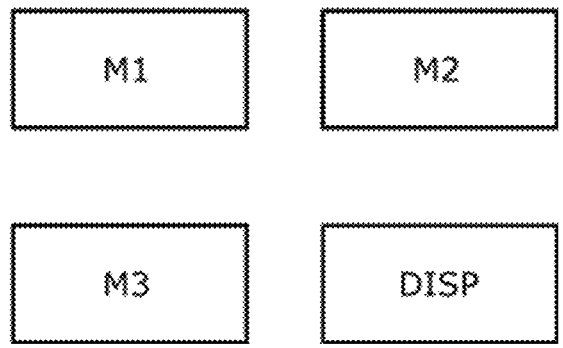

INTERCONNECTION ELEMENT, PHOTOVOLTAIC STRING AND ASSOCIATED METHODS

CROSS-REFERENCE TO RELATED APPLICATIONS

This application claims priority to French Patent Application No. 2205766, filed Jun. 14, 2022, the entire content of which is incorporated herein by reference in its entirety.

FIELD

The technical field of the invention is that of interconnection elements for interconnecting photovoltaic cells within a photovoltaic string.

BACKGROUND

Photovoltaic cells can be connected together in series to form a photovoltaic string. The photovoltaic string thus makes it possible to generate a high voltage for a same short-circuit current. A photovoltaic string can comprise around sixty photovoltaic cells, connected to each other by means of a plurality of conductive elements known as "interconnection elements". Each interconnection element connects, for example, an upper face of one cell to a lower face of another cell. Electrical connection is made by bonding, using an electrically conductive adhesive that is cross-linked, or by welding, using a conductive alloy usually derived from the coating of the interconnection element or as a filler metal. The interconnection element may have a rectangular cross-section (rather referred to as a strip) or circular cross-section (rather referred to as a wire). An interconnection strip (with a rectangular cross-section) offers a large contact surface area for making the electrical and/or mechanical connection. However, it casts a shadow over the cells, which reduces the final electrical output of the photovoltaic string. The wire (with a circular cross-section) reduces the cast shadow by virtue of its narrow transverse width and by virtue of reflections of light rays on its curved surface. On the other hand, it has two major drawbacks. Firstly, it offers a small contact surface area for bonding or welding to one face of a cell. On the other hand, its small contact surface area reduces mechanical adhesion of the wire to the cell and increases contact resistance.

Document CN 104576767 A provides a solution to these drawbacks by using an interconnection wire having a flat extending along its entire length. In the particular case set forth, the flat provides a larger surface area for welding the conductor wire to a cell, thereby improving mechanical adhesion and contact resistance. Since the wire retains a partially circular cross-section, shading is also reduced compared to a strip with a rectangular cross-section. However, the reduction in the effective shading of the wire is not as high as a wire with a perfectly circular cross-section could provide.

There is therefore a need to provide an interconnection element offering good mechanical and/or electrical connection, while further reducing its effective shading.

SUMMARY

For this purpose, an aspect of the invention relates to an interconnection element extending along a first direction, the interconnection element being remarkable in that it comprises:

first and second ends opposite to each other; and
first, second and third portions extending between the first and second ends,
  the first portion having a first planar surface oriented along a second direction perpendicular to the first direction;
  the second portion, distant from the first portion and the second end, the second portion having a second planar surface oriented along the second direction;
  the third portion, between the first portion and the second portion, and having a circular cross-section.

Each planar surface has a mechanical and/or electrical, contact surface area, greater than the surface area offered by an element having only a constant circular cross-section. Unlike the interconnection element set forth in prior art (CN 104576767 A), the interconnection element according to the invention has, between two planar surfaces, an entirely circular cross-section. This circular cross-section offers the benefit of minimizing shading it produces, by virtue of, especially, reflections that can occur at its surface. Moreover, this circular cross-section has not been subjected to forming stresses.

Beneficially, the first portion extends from the first end. Alternatively, the first portion is distant from the first end, such as by at least 0.5 mm and less than 12 mm, for example by at least 2 mm.

Beneficially, the third portion separates the first portion from the second portion of the first portion. In other words, it extends from the first portion to the second portion.

Beneficially, the cross-section of the third portion is perpendicular to the first direction. Beneficially, the third portion has a circular cross-section over its entire length (measured along the first direction).

Beneficially, a cross-section of the first portion comprises an arc of a circle, at least one line segment and two curve segments, the at least one line segment being parallel to a third direction perpendicular to the first and second directions, the two curve segments joining the arc of a circle and the at least one line segment, the area of the cross-section of the first portion being equal to the area of the cross-section of the third portion. Beneficially, the cross-section of the first portion is parallel to the cross-section of the third portion. In an embodiment, a cross-section of the second portion also has an area equal to the area of the cross-section of the third portion. To this end, it may also comprise an arc of a circle, at least one line segment and two curve segments joining the arc of a circle and the at least one line segment. The cross-section of the second portion is here also beneficially parallel to the cross-section of the third portion.

Beneficially, the first and second planar surfaces are tangent to the third portion. By tangent, it is meant that the planar surfaces are aligned with one and only one generatrix of the third portion. Tangent is intended to within one measurement error or one manufacturing error. In fact, obtaining the planar surfaces, for example by squeezing, can show an inverse deformation (for example elastic), tending to misalign the planar surfaces and the generatrix of the third portion. The planar surfaces and the generatrix of the third portion are considered to be aligned when they have a relative deviation, with respect to each other, of less than 10%, or even less than 5%, of the diameter of the cross-section of the third portion.

Beneficially, the circular cross-section of the third portion has a diameter D, the first planar surface has a first width measured along a third direction perpendicular to the first and second directions, the first width being greater than 0.6×D, for example greater than 0.9×D.

Beneficially, the diameter D of the circular cross-section of the third portion is between 150 µm and 400 µm and for example between 200 µm and 350 µm.

Beneficially, the first portion has a first height, measured along the second direction, of between 0.60×D and 0.9×D, and for example between 0.65×D and 0.80×D.

Beneficially, the first portion has a first length, measured along the first direction, of between 4 mm and 16 mm, and for example of between 6 mm and 10 mm.

Beneficially, the interconnection element also comprises:
fourth, fifth and sixth portions extending between the first and second ends,
the fourth portion having a third planar surface, oriented along a direction opposite to the second direction;
the fifth portion, distant from the fourth portion and the first end, the fifth portion having a fourth planar surface oriented along the direction opposite to the second direction; and
the sixth portion, between the fourth portion and the fifth portion and having a circular cross-section.

Beneficially, the fourth portion extends from the second end. Alternatively, the fourth portion is distant from the second end, for example by at least 0.5 mm and less than 12 mm, for example by at least 2 mm.

Beneficially, the sixth portion separates the fourth portion from the fifth portion. In other words, it extends from the fourth portion to the fifth portion.

Beneficially, the cross-section of the sixth portion is perpendicular to the first direction. Beneficially, the sixth portion has a circular cross-section over its entire length.

Beneficially, the second portion and the fourth portion are at least partially the same.

Alternatively, the second portion and the fifth portion are distant from each other, for example by at least 0.5 mm and even in an embodiment by less than 2 mm.

Beneficially, the second portion has an additional second planar surface, opposite to the second planar surface. In the same way, the first portion may have a first additional planar surface, opposite to the first planar surface.

Beneficially, the fourth and/or fifth portions also have additional fourth and/or fifth planar surfaces, opposite to the fourth and/or fifth planar surfaces.

Another aspect of the invention further relates to a photovoltaic string comprising first and second photovoltaic cells, the second photovoltaic cell being electrically connected to the first photovoltaic cell, the two photovoltaic cells are parallel to a plane, the first photovoltaic cell comprising:
first and second edges opposite to each other;
a first face, oriented along a fourth direction perpendicular to the plane, the first face comprising a first plurality of portions to be connected to an interconnection element, the first plurality of portions to be connected being distributed between the first edge and the second edge along a fifth direction perpendicular to the fourth direction.

The photovoltaic string is remarkable in that it comprises at least one interconnection element according to the first aspect of the invention, partly extending over the first face and over the first plurality of portions to be connected, the at least one interconnection element extending, along the fifth direction, beyond the second edge so as to reach the second photovoltaic cell, the first surface of the first portion of the at least one interconnection element being connected to a first portion to be connected of the first plurality of portions to be connected, the second surface of the second portion of the at least one interconnection element being connected to a second portion to be connected of the first plurality of portions to be connected.

Beneficially, the first portion to be connected is the portion of the first plurality of portions to be connected closest to the first edge and the second portion to be connected is the portion of the first plurality of portions to be connected closest to the second edge.

Beneficially, the first and second portions to be connected of the first plurality of portions to be connected have a free surface and/or a metallized surface.

Beneficially, the photovoltaic string also comprises conductive adhesive paste adhering to each of the first and second portions to be connected of the first plurality of portions to be connected and to the interconnection element, the thickness of the conductive adhesive paste being less than 70 µm and for example less than 40 µm.

Beneficially, the photovoltaic string also comprises a conductive alloy welded to each of the first and second portions of the first plurality of portions to be connected and to the interconnection element.

Beneficially, the second photovoltaic cell comprises:
third and fourth edges opposite to each other, the third edge being parallel to and facing the second edge of the first photovoltaic cell;
a second face, oriented along a direction opposite to the fourth direction, the second face comprising a second plurality of portions to be connected, distributed between the third edge and the fourth edge along the fifth direction.

The at least one interconnection element beneficially extends along the fifth direction on the second face and on the second plurality of portions to be connected, the third surface of the fourth portion of the at least one interconnection element being connected to a fourth portion to be connected of the second plurality of portions to be connected, the fourth surface of the fifth portion of the at least one interconnection element being connected to a third portion to be connected of the second plurality of portions to be connected.

Beneficially, the fourth portion to be connected of the second plurality of portions to be connected is the portion closest to the fourth edge and the third portion of the second plurality of portions to be connected is the portion closest to the third edge.

Another aspect of the invention also relates to a method for manufacturing an interconnection element comprising the following steps of:
providing a conductive wire, extending along a first direction, having a circular cross-section along its entire length;
forming, at a first portion of the conductor wire, a first planar surface oriented along a second direction perpendicular to the first direction;
forming, at a second portion, distant from the first portion, a second planar surface oriented along the second direction, a third portion, disposed between the first and second portions, having a circular cross-section and;
cutting the conductive wire so as to form first and second ends opposite to each other, the first, second and third portions extending between the first and second ends, the second portion being distant from the second end of the conductive wire.

Beneficially, the conductive wire comprises, prior to the steps of forming the first and second planar surfaces, a fusible alloy coating.

Beneficially, the first and/or second planar surfaces are formed by squeezing the conductor wire at the first and/or second portions respectively. Squeezing the conductor does not require complex means such as drawing dies. Furthermore, it is not necessary to substantially modify the equipments used when the initial diameter and/or the material making up the conductor change. In addition, the interconnection element can be obtained from a conductor which, before squeezing, has a coating, for example of a fusible alloy.

Beneficially, the pressure applied to the conductor wire during squeezing is between 250 N/mm 2 and 700 N/mm$^2$.

Another aspect of the invention also relates to a method for manufacturing a photovoltaic string comprising the following steps of:
- providing first and second photovoltaic cells, both photovoltaic cells being parallel to a plane, the first photovoltaic cell comprising:
  - first and second edges opposite to each other;
  - a first face, oriented along a fourth direction, perpendicular to the plane, the first face comprising a first plurality of portions to be connected to an interconnection element, the first plurality of portions to be connected being distributed between the first edge and the second edge along a fifth direction perpendicular to the fourth direction;
- interconnecting the second photovoltaic cell to the first photovoltaic cell by means of at least one interconnection element according to the first aspect of the invention, the at least one interconnection element being deposited onto the first face of the first photovoltaic cell so that it partly extends over the first face and over the first plurality of portions to be connected, and so that it extends, along the fifth direction, beyond the second edge until it reaches the second photovoltaic cell, the first surface of the first portion of the at least one interconnection element being connected to a first portion to be connected of the first plurality of portions to be connected and the second surface of the second portion of the at least one interconnection element being connected to a second portion to be connected of the first plurality of portions to be connected.

Beneficially, the interconnection step comprises the following steps of:
- depositing a portion of conductive adhesive paste onto each of the first and second portions to be connected; and
- pressing:
  - the first surface of the first portion of the at least one interconnection element onto the portion of conductive adhesive paste disposed on the first portion to be connected; and
  - the second surface of the second portion of the at least one interconnection element onto the portion of conductive adhesive paste disposed on the second portion to be connected.

Beneficially, the method for manufacturing comprises, after interconnecting, the following complementary step of: heat treating at least the first photovoltaic cell and the at least one interconnection element, a pressure being exerted at each of the first and second portions of the at least one interconnection element along a direction opposite to the fourth direction, during the treatment step, the pressure being, in an embodiment, greater than 1 N/mm$^2$.

Beneficially, the method for manufacturing the photovoltaic string also comprises, before the interconnection step, a step of manufacturing the at least one interconnection element according to the method for manufacturing an interconnection element according to an aspect of the invention.

Another aspect of the invention also relates to a device for manufacturing an interconnection element comprising a system adapted to perform the steps of the method for manufacturing an interconnection element according to an aspect of the invention.

The system comprise, for example, a guide and an anvil configured to form the first and second planar surfaces by squeezing the conductor wire at a first portion and at a second portion.

Another aspect of the invention also relates to a computer program comprising instructions which cause the device according to the invention to perform the steps of the method for manufacturing an interconnection element according to the invention.

Another aspect of the invention also relates to a non-transitory computer-readable medium, on which the aforementioned computer program is recorded.

Another aspect of the invention also relates to a piece of equipment for manufacturing a photovoltaic string comprising:
- a photovoltaic cell manipulator configured to arrange first and second photovoltaic cells in a plane and orient a first face of the first photovoltaic cell along a fourth direction, perpendicular to the plane;
- an interconnection element manipulator comprising an alignment system, configured to deposit at least one interconnection element onto the first face of the first photovoltaic cell so that it partly extends over the first face and over a first plurality of portions to be connected of the first face, and so that it extends along a fifth direction until it reaches the second photovoltaic cell, the first surface of the first portion of the at least one interconnection element being disposed on a first portion to be connected of the first plurality of portions to be connected, and the second surface of the second portion of the at least one interconnection element being disposed on a second portion to be connected of the first plurality of portions to be connected; and
- a connection system configured to connect the first surface of the first portion of the at least one interconnection element to the first portion to be connected of the first plurality of portions to be connected; and connect the second surface of the second portion of the at least one interconnection element to the second portion to be connected of the first plurality of portions to be connected.

Beneficially, the equipment comprises a manufacturing device according to an aspect of the invention.

The equipment may also comprise a pressure system adapted to exert pressure at each of the first and second portions of the at least one interconnection element along a direction opposite to the fourth direction during the treatment step, the pressure being, in an embodiment, greater than 1 N/mm$^2$.

An aspect of the invention also relates to a computer program comprising instructions which cause the equipment according to the invention to perform the steps of the method for manufacturing a photovoltaic string according to the invention.

Another aspect of the invention also relates to a non-transitory computer-readable medium, on which the aforementioned computer program is recorded.

The invention and its different applications will be better understood upon reading the following description and upon examining the accompanying figures.

BRIEF DESCRIPTION OF THE FIGURES

The figures are set forth by way of illustrating and in no way limiting purposes of the invention. Unless otherwise specified, a same element appearing in different figures has a single reference.

FIG. 1, FIG. 2, FIG. 3 and FIG. 4 show first, second and third embodiments of an interconnection element according to the invention.

FIG. 5 shows an example of bonding the interconnection element of FIG. 1 to a photovoltaic cell.

FIG. 6, FIG. 7 and FIG. 8 illustrate a first mode of implementation of a method for manufacturing the interconnection element of FIG. 1 and FIG. 2.

FIG. 9 illustrates a second mode of implementation for manufacturing the interconnection element.

FIG. 10 and FIG. 11 show a fourth embodiment of the interconnection element according to the invention, derived from the method of FIG. 9.

FIG. 12 and FIG. 13 show a fifth embodiment of the interconnection element according to the invention.

FIG. 14 shows a principle of manufacture of the interconnection element of FIG. 12 and FIG. 13.

FIG. 15 shows a sixth embodiment of the interconnection element according to the invention.

FIG. 16 shows an example of welding the interconnection element of FIG. 15 to a photovoltaic cell.

FIG. 17, FIG. 18, FIG. 19 and FIG. 20 show seventh, eighth, ninth and tenth embodiments of the interconnection element according to the invention.

FIG. 21 and FIG. 22 show first and second embodiments of a photovoltaic string according to the invention.

FIG. 23 schematically shows a method for manufacturing a photovoltaic string according to the invention.

FIG. 24 schematically shows an embodiment of a piece of equipment according to the invention.

DETAILED DESCRIPTION

A first aspect of the invention relates to an interconnection element. The interconnection element makes it possible to increase mechanical adhesion and/or electrical contact within a photovoltaic string while reducing the shading thereof onto a photovoltaic cell.

FIG. 1 and FIG. 2 show, in three different views, a first embodiment of an interconnection element INTR according to the invention.

The interconnection element INTR extends along a first direction X1, illustrated in the figures. The interconnection element INTR comprises first and second ends EXT1, EXT2, disposed on either side of the element INTR.

The interconnection element INTR comprises a first portion P1 and a second portion P2. The first portion P1 has a length L1. It is especially distant from the first end EXT1 of the element INTR, by a length L10 which may be between 0.5 mm and 12 mm, or even up to 15 mm. The second portion P2 extends over a length L2. The second portion P2 is distant from the second end EXT2 by a length L4. The second portion P2 is distant from the first portion P1 and from the second end EXT2.

A third portion P3 extends between the first portion P1 and the second portion P2. The third portion P3 extends over a length L3. In the embodiment of FIG. 2, the portion P3 is distant from the first and second portions P1, P2.

The first portion P1 has a first planar surface S1, oriented along a second direction Y1 perpendicular to the first direction X1. In the same way, the second portion P2 also has a second planar surface S2, oriented along the second direction Y1. The third portion P3, in turn, has a constant circular cross-section CIRC. By "constant", it is meant over its entire length. In the embodiment of FIG. 2, the portion P3 is distant from the first and second portions P1, P2, which means that between the portions P1 and P3 and between the portions P2 and P3, the interconnection element may have a non-circular cross-section.

Beneficially (as illustrated in FIG. 4), the third portion P3 extends from the first portion P1 to the portion P2.

The first and second portions P1, P2 result, for example, from localized squeezing of the interconnection element INTR. For example, the interconnection element INTR initially has a circular cross-section CIRC over at least part of its length (where the portions P1, P2 and P3 will be disposed) and in an embodiment over its entire length. It may be an initially cylindrical conductor wire. The interconnection element INTR, illustrated in FIG. 1 and FIG. 2, may then result from the squeezing of the wire at the first and second portions P1, P2 so as to form the two planar surfaces S1, S2. The third portion P3 remains intact and thereby retains its circular cross-section.

More particularly, FIG. 1 shows a cross-section of the conductor, in a plane {Y1; Z1}, at the first portion P1. The dotted line contour corresponds to the circular cross-section CIRC of the element INTR at the third portion P3, the cross-section being parallel to the plane {Y1; Z1}. The solid outline corresponds to the cross-section of the element INTR at the first portion P1. In this example, the planar surface S1 has been made by squeezing on the "bottom" part of the conductor, that is along the direction −Y1. The solid outline shows an arc of a circle that is partly the same as the dotted outline. The solid outline also shows a line segment SEG, extending along a third direction Z1. This line segment belongs to the surface S1, which extends in the plane {X1; Z1}. The solid outline also shows two curve segments EPA1, EPA2, joining the arc of a circle ARC and the line segment SEG. These two curve segments EPA1, EPA2 form two shoulders corresponding to the material which can be found on the edges of the element INTR and partly forms the planar surface S1. This is, for example, the material pushed onto the edges of the element upon shaping it, when this is carried out by squeezing. Neglecting the change in volume of the material that may occur during squeezing, the area surrounded by the dotted outline is equal to the area surrounded by the solid outline.

A cross-section at the second portion P2, along a plane parallel to the plane {Y1, Z1}, would show the same type of cross-section as that represented by the solid line in FIG. 1.

FIG. 2 shows a side view (in the plane {X1, Y1}) and a bottom view (in the plane {X1, Z1}) of part of the element INTR. The bottom view makes it possible especially to distinguish the first and second planar surfaces S1, S2 (wavy hatching). The thickness of the element INTR, measured along Y1, at the first and second portions P1, P2, is reduced compared to the thickness of the element INTR at the third portion P3. This localized reduction of the element INTR results, for example, from it being squeezed. The width of the planar surfaces S1, S2, measured along Z1, is beneficially greater than the width of the element INTR (in other words its diameter) at the third portion P3. According to one alternative, the width of the planar surfaces S1, S2 may be less than the width of the element INTR.

For example, FIG. 3 illustrates an exemplary embodiment of the element in which the width W1 of the planar surface S1 is less than the diameter D of the element. However, the element has a sufficiently wide planar surface to improve its connection to a photovoltaic cell.

Each portion P1, P2 (as represented by FIG. 2) may have at least one, more or less pronounced, beveled part. Each beveled part connects one of the planar surfaces S1, S2 to the cylindrical part of the third portion P3. It may also result from squeezing of the element INTR.

FIG. 4 shows an embodiment in which the first portion P1 extends from the first end EXT1 of the element INTR and over a length L1.

FIG. 5 shows, in a cross-sectional view, an example of bonding the interconnection element INTR according to one of FIG. 1, FIG. 2 or FIG. 4 to a portion PAD of a photovoltaic cell CELL. Bonding is carried out by means of an adhesive portion ECA, which may be an electrically conductive adhesive. The adhesive portion makes the mechanical connection and in an embodiment the electrical connection of the interconnection element to the cell CELL. The interconnection element INTR offers larger bonding surfaces S1, S2 than a purely cylindrical conductor. The adhesion force, proportional to the bonded surface area, is therefore increased. The probability of detachment, for example by peeling, is therefore reduced.

In practice, the portion of adhesive ECA is generally deposited onto the cell before transferring an interconnection element INTR. Because of the imprecision of the alignment of the element INTR, it is appropriate to deposit an adhesive portion ECA which is very wide so as to make sure that the interconnection element will be properly located on the portion of adhesive but the adhesion force remains proportional to the surface area of the element INTR in contact with the ECA. Increasing the width of the planar surface S1 allows the interconnection element INTR to provide better adhesion.

Prior art comprises a conductor with a planar surface (described as a flat extending along the whole length of the conductor). However, this planar surface does not have the shoulders EPA1, EPA2 on either side, as represented in FIG. 1 or FIG. 3. Instead, the planar surface follows an arc inscribed in a circular cross-section of the conductor. The planar surface without shoulders EPA1, EPA2 therefore has a maximum width WARC, measured along Z1, which is less than the width W1 of the planar surface S1.

The planar surfaces S1, S2 therefore offer a reduced contact resistance compared with a purely cylindrical conductor or a conductor have with a planar surface having width WARC.

The third portion P3 has a circular cross-section with diameter D. The diameter D may be between 150 μm and 400 μm, or even between 200 μm and 350 μm. When the planar surfaces S1, S2 are obtained by squeezing the element INTR, the width of each surface S1, S2 depends on the initial diameter of the conductor (equal to the diameter D at the third portion P3) and its height reduction (measured along Y1). Indeed, the more the element INTR is squeezed, the more material is transferred to the shoulders delimited by the curve segments EPA1, EPA2, thereby increasing the width of each planar surface S1, S2. FIG. 1 and FIG. 3 show, for example, the height H1 of the first portion P1 and the width W1 of the first planar surface S1 for two different crushing operations. The height is measured along the direction Y1 (beneficially parallel to the direction of squeezing). The quantity of material transferred into the shoulders EPA1, EPA2 is derived from the portion of circle having height D−H1.

The height H1, measured along the direction −Y1, is beneficially between 0.60×D and 0.9×D. Considering that the third portion P3 has an initial diameter D=350 μm, the height H1 is then between 210 μm and 315 μm. In an embodiment, the height H1 is between 0.75×D and 0.85×D.

The first planar surface S1 has a width W1 beneficially greater than 0.6×D (case of FIG. 3) and in an embodiment greater than 0.9×D, for example 1.4×D (case of FIG. 1).

Each portion P1, P2 beneficially has a length L1, L2 of between 4 mm and 16 mm. In this way, the total surface area offered by the first and second planar surfaces S1, S2 significantly improves its adhesion to a cell. The lengths L1 and L2 are in an embodiment chosen between 6 mm and 10 mm.

The third length L3 of the third portion P3 beneficially depends on a dimension of the photovoltaic cell to which the interconnection element will be connected. The first and second surfaces S1, S2 of the interconnection element INTR may be placed in the vicinity of the edges of the cell. The maximum length of the third portion P3 is therefore chosen to meet this criterion. For example, for a half-cell from a "G12" format cell, that is having a length of ½×210=105 mm, the length L3 may be a maximum of 97 mm (105 mm-2×4 mm if the planar surfaces each extend over 4 mm and are positioned at the edges).

FIG. 6 to FIG. 8 illustrate a method for manufacturing FABINTR of the interconnection element of FIG. 1 and FIG. 2 (the portion P1 of which is distant from the first end EXT1). The method FABINTR comprises, firstly, a step of providing FI1 a conductive wire FIL. The conductor wire FIL is to form the interconnection element INTR once it has been shaped. For this end, it has a circular cross-section over at least part of its length and beneficially over its entire length. The conductor wire can already have first and second ends EXT1, EXT2. However, it may be beneficial to cut FI4 the wire after forming FI2, FI3 the first and second portions P1, P2 and their planar surfaces S1, S2. The wire is in an embodiment straight and extends along the first direction X1. The method FABINTR comprises forming, at a first portion P1 of the wire, a first planar surface S1 oriented along the second direction Y1, perpendicular to the first direction X1. The forming step FI2 comprises, for example, squeezing the conductive wire FIL, represented by FIG. 7 to FIG. 8. The wire is squeezed at the first portion P1 of the wire (that is over a length L1 and, in this case, distant from one end of the wire). It is carried out so as to form the first planar surface S1, oriented along the direction Y1.

FIG. 7 and FIG. 8 show, in two cross-section views, an example of implementation of the squeezing step of the manufacturing method FABINTR. The conductive wire FIL is inserted into a guide GD which rests on the upper surface of the wire. The guide GD surrounds, for example, the upper half of the wire (which will form the arc of a circle in the cross-section of the first portion P1). A piece ENC (also referred to as an "anvil"), having a planar surface in the plane {X1; Z1}, comes into contact with the conductor wire FIL in the direction −Y1 and squeezes the conductor wire FIL in the guide GD. The wire, trapped between the guide GD and the anvil ENC, deforms. The material pushed aside by the anvil ENC forms the shoulders EPA1, EPA2.

The guide may also have a flared shape, opening along the direction Y1, in order to facilitate formation of the shoulders EPA1, EPA2. In this way, there is a little more room for the material to creep along the sides of the wire. For example, a cross-section of the guide GD has a semicircle and two line segments extending from the ends of the semicircle outwardly of the guide, as an inverted 'V'.

The pressure applied by the anvil ENC to the wire depends on the material used. It is in an embodiment between 250 N/mm 2 and 700 N/mm². In one example, a pressure of 430 N/mm² is applied to a copper wire with a diameter of 350 μm and a length of 5 mm (corresponding to a total force of 750 N). Such pressure makes it possible to have a planar surface with a width of 350 μm (that is equal to the initial diameter of the wire).

Document CN 103537496 B discloses, for example, a method for manufacturing a metal strip with a rectangular cross-section. The same principle can be applied to the wire of document CN 104576767 A (cited in prior art) in order to form the flat along the wire. The strip shaping disclosed is carried out by drawing in a plurality of dies responsible for reducing the total cross-section of the wire and shaping different planar faces of the wire. However, drawing requires continuous pulling of the material through the dies, necessitating substantial mechanical power. In addition, this type of method can cause fine wire to break. Drawing is also not compatible with a wire that already has a coating, such as a fusible alloy coating, since the coating would be torn off and/or remixed with the material making up the conductive wire (the coating can be between 2 μm and 3 μm thick). Wire drawing is also a method which requires the adjustment of several operating parameters (such as the tensile force and/or the diameters and number of dies) making it complex to change the characteristic of the wire (such as its diameter) or to change the material constituting the wire.

On the other hand, the manufacturing method FABINTR according to an aspect of the invention is simple to implement. Indeed, it is not necessary to resort to wire drawing. The method can also be carried out using wire interconnection elements which may have different diameters or materials. The method FABINTR can also form the planar surfaces S1, S2 from a conductor having already a fusible alloy coating without this being torn off or remixed.

FIG. 9 shows an alternative to the step of forming the planar surfaces of FIG. 7 and FIG. 8 in which the anvil ENC has a projecting part IND, for example extending along the first direction X1. This projecting part IND, known as the "punch", penetrates the wire material during squeezing. It especially facilitates transfer of material to the sides of the wire, so as to form the shoulders EPA1, EPA2.

FIG. 10 and FIG. 11 show one embodiment of the interconnection element INTR obtained by squeezing according to FIG. 9, by means of the punch. The element INTR has, at the first and second portions P1, P2, a trench, which can separate the planar surface into two parts.

For example, FIG. 10 shows the cross-section of the first portion P1 which comprises two line segments SEG', SEG", aligned along the third direction Z1. Each segment SEG', SEG" is connected to a curve segment EPA1, EPA2.

FIG. 11 shows the first and second planar surfaces S1, S2. The first planar surface S1 has a trench TRE which extends along the entire length of the surface, along the first direction X1. The second planar surface S2 has a trench TRE which extends along only part of the length of the surface.

The trench TRE makes it possible to increase the width W1 of the planar surface S1 without further squeezing the conductor wire. In addition, since the depth of the trench is controlled (discussed below), it also participates in bonding/welding. The surface area involved in adhesion is therefore significantly increased.

The trench may have a depth, measured along the second direction Y1, from the planar surface, less than or equal to ⅓×D (where D is the diameter of the cross-section of the third portion P3, it is also the initial diameter of the conductor before squeezing). For an element INTR having a diameter of 350 μm, the depth of the trench TRE can be 100 μm. Beneficially, the depth of the trench is between ⅙×D and ⅓×D. The trench is relatively deep and may allow adhesive or welding alloy to penetrate the trench and extend against a substantially larger surface area.

The depth of the trench may also be less than ⅙×D. In this way, a reduced amount of adhesive or alloy penetrates the trench which prevents uncontrolled creep of the bonding/welding means during connection to a photovoltaic cell.

FIG. 12 and FIG. 13 show a second embodiment of the interconnection element INTR in which the first and second planar surfaces S1, S2 are tangent to the circular cross-section CI RC (dotted line in FIG. 12) of the third portion P3. In this way, the interconnection element INTR does not have a change in level between the planar surfaces S1, S2 and the third portion P3. The element INTR can be placed on a planar surface, such as a photovoltaic cell, leaving little or no clearance. This makes it easier to connect the element INTR to a cell.

When the surfaces are tangent to the third portion P3, they are aligned with a single generatrix G (illustrated in FIG. 13) of the portion P3. The alignment of the planar surfaces S1, S2 with the generatrix G. On the other hand, squeezing can be elastoplastic and show reverse deformation after alignment of the surfaces and the generatrix. The gap between the surfaces and the generatrix is then beneficially compensated for by pressing when the element INTR is connected to a cell.

The first and second planar surfaces S1, S2 (wavy hatching in FIG. 13) may also have a slightly larger surface area than those of the embodiments of FIG. 2 and FIG. 4. Indeed, the portions P1, P2 in FIG. 2 and FIG. 4 show bevels between the planar surfaces and the curved surfaces (for example at the third portion P3). These bevels are absent from the element INTR in the embodiment of FIG. 13 because the planar surfaces are tangent to the main curved surface. The area of the first and second planar surfaces S1, S2 is therefore slightly increased (it includes the area of the initially beveled parts).

FIG. 14 shows an embodiment of the squeezing step FI2, for making the first planar surface S1. Unlike the method illustrated in FIG. 5 and FIG. 6, the assembly comprising the guide GD and the anvil ENC undergo translation to compensate for the deformation of the conductive wire FIL. Squeezing can also be achieved by pressing the guide GD onto the wire, without moving the anvil ENC. Beneficially, the anvil ENC extends over the first portion P1 and under at least part of the third portion P3. In this way, the generatrix G of the third portion P3 is more easily aligned with the planar surface S1 formed.

FIG. 15 shows an embodiment of the interconnection element INTR in which, the element INTR comprises, prior to shaping, a fusible alloy coating REV. The fusible alloy coating REV enables welding to be carried out without filler material. The implementation of the method for manufacturing FABINTR according to the invention, for example by squeezing, enables the fusible coating to be retained around the element INTR. When the wire has a coating REV, it is desirable for the squeezing to be limited, such as that represented in FIG. 3. This is because severe squeezing can damage the coating REV at the acute angles of the shoulders EPA1, EP2.

FIG. 16 shows welding of the element INTR of FIG. 15 to a photovoltaic cell. A heat treatment, applied to the element INTR, liquefies the meltable alloy which will wet the surface of the interconnection element INTR and the surface of the photovoltaic cell (and more particularly metallized parts of this cell). Cooling the alloy provides a strong mechanical connection between the interconnection element INTR and the photovoltaic cell.

The fact that the meltable alloy coating REV can be present before the final shaping of the interconnection element INTR simplifies the manufacture thereof while providing a good mechanical contact. In addition, as the shaping (for example by squeezing) does not substantially redistribute the coating around the perimeter of the element INTR, the welding reproducibility is preserved.

FIG. 17, FIG. 18, FIG. 19 and FIG. 20 show four further embodiments of the interconnection element INTR. Unlike the embodiments set out previously (especially those corresponding to FIG. 2, FIG. 4, FIG. 11, and FIG. 13), the interconnection element INTR has at least third and fourth planar surfaces S3, S4.

Indeed, the interconnection element INTR has fourth and fifth portions P4, P5. The fourth portion P4 extends over a length L5, for example. It may extend from the second end EXT2 (as illustrated in FIG. 17, FIG. 18, FIG. 19 and FIG. 20) or be distant from the second end EXT2, for example by at least 0.5 mm. The fifth portion P5 is distant from the fourth portion P4 and from the first end EXT1. The fifth portion P5 extends over a length L6. It is distant from the fourth portion P4 by a length L7 and from the first end EXT1 by a length L8.

The fourth and fifth portions P4, P5 respectively have third and fourth planar surfaces S3, S4. Unlike the first and second planar surfaces S1, S2, the third and fourth planar surfaces S3, S4 are oriented along a direction opposite to the second direction Y1 (that is along the direction −Y1). The third planar surface S3 belongs to the fourth portion P4. The fourth planar surface S4 belongs to the fifth portion P5.

In the embodiment of FIG. 17, the second and fifth portions P2, P5 are distant from each other by a length L9. The length L9 is in an embodiment between 0.5 mm and 2 mm. In the embodiment of FIG. 18, the second and fifth portions P2, P5 are adjacent. The length L9 therefore does not exist. In the embodiment of FIG. 19, the second and fifth portions P2, P5 are at least partially the same. At least part of the fourth planar surface S4 is therefore in vertical alignment with at least part of the second planar surface S2. According to a variant, the fourth planar surface S4 is in vertical alignment with the second planar surface S2.

In the embodiment shown in FIG. 18, the interconnection element changes plane. That is, it passes from a first plane, parallel to the plane {X1, Y1}, to a second plane, also parallel to the plane {X1, Y1}. The element INTR then comprises a bend so that it extends, at least over a short distance, along the direction Z1. This bend makes it possible to connect photovoltaic cells in series, when they are arranged in a same plane.

The interconnection element INTR of FIG. 20 also has, in addition to the four planar surfaces S1, S2, S3, S4 set out above, a second additional planar surface S2' and a fourth additional planar surface S4'. The additional planar surfaces S2', S4' belong to the second portion P2 and the fifth portion P5 respectively. The second additional planar surface S2' is opposite to the second planar surface S2 and, in an embodiment, parallel thereto. The fourth additional planar surface S4' is also opposite to the fourth planar surface S4 and in an embodiment also parallel thereto.

The additional planar surfaces S2', S4' can be obtained by squeezing the interconnection element INTR. On the other hand, instead of using a guide (as illustrated in FIG. 5) to maintain a cross-section comprising an arc of a circle, a second anvil may be used.

Making additional planar surfaces simplifies shaping of the interconnection element INTR. Indeed, in current equipments, the wires pass through rectangular ports to be gripped and pulled along the length of the cell to be connected. The width of the ports is greater than the width of the wires so that the wires can be easily aligned with these openings. Double-sided planar squeezing can therefore be carried out at these openings, before being gripped, by means of two anvils, facing each other, which locally squeeze the wire.

The partially cylindrical shape of the first and second portions may require the wire to be inserted into a guide GD, which may be in the form of a chute comprising an opening having the size of the wire. Alignment is more complex to achieve.

The first and/or fourth portions could also have additional planar surfaces, opposite to the planar surfaces.

FIG. 21 and FIG. 22 show two embodiments of a photovoltaic string STR according to the invention. The string STR comprises at least two photovoltaic cells CELL1, CELL2, interconnected in series. The second photovoltaic cell CELL2 is electrically and mechanically connected to the first photovoltaic cell CELL1 by means of at least one interconnection element INTR as set out above and for example by means of a plurality of interconnection elements INTR as set out previously. FIG. 21 and FIG. 22 show a string STR comprising a single interconnection element INTR. However, the teachings described below also apply to a string STR comprising a plurality of interconnection elements INTR. FIG. 21 shows an exploded view of the string STR with one element INTR. FIG. 22 shows the string STR assembled with an element INTR. The two photovoltaic cells CELL1, CELL2 are arranged parallel to a plane. In FIG. 22, the cells CELL1, CELL2 are arranged in this same plane.

In common with FIG. 16 and FIG. 17, the first photovoltaic cell CELL1 comprises first and second edges EDG1, EDG2, opposite to each other. It also comprises a first face FAV, oriented along a fourth direction X2, perpendicular to the plane in which the first cell CELL1 extends. The second photovoltaic cell CELL2 has third and fourth edges EDG3, EDG4, opposite to each other. The third edge EDG3 is, in an embodiment, parallel to and facing the second edge EDG2. The second cell CELL2 also comprises a second face FAR, oriented along a direction −X2 opposite to the fourth direction X2. The first face FAV of the first cell CELL1 may correspond to a front face of the cell CELL1, that is a face to be exposed in a privileged manner to electromagnetic radiation such as solar radiation. The second face FAR of the second cell CELL2 may correspond to a rear face of the cell CELL2.

The cells CELL1 and CELL2 may be formed from silicon. They may be silicon homojunction or silicon heterojunction cells. The cells CELL1, CELL2 may have, on their surfaces, an insulating layer (in the case of a homojunction cell) or a conductive oxide layer (in the case of a heterojunction cell). They may also have, on their surfaces, for example on the conductive oxide layer, mentalizations such as metal pads, conductive lines or collection electrodes.

The first face FAV of the first cell CELL1 comprises a first plurality of portions to be connected to the interconnection element INTR. The first plurality of portions to be connected is distributed between the first edge EDG1 and the second edge EDG2 along a fifth direction Y2 perpendicular to the fourth direction X2. The fifth direction Y2 is beneficially the direction in which the string STR extends. The first and second edges EDG1, EDG2 beneficially extend along a sixth direction Z2, perpendicular to the fourth and fifth directions X2, Y2. Each portion of the first plurality of portions to be connected may have a free surface, such as a portion of conductive oxide only, or a metallized surface, such as a conductive line or a metal pad, or a combination of these elements, that is pads and/or a conductive line extending over a conductive oxide.

An interconnection element INTR extends, along the fourth direction X2, partly on the first face FAV of the first cell CELL1 and more particularly on each of the portions to be connected of the first plurality of portions to be connected. The interconnection element INTR extends beyond the second edge EDG3 until it reaches the second photovoltaic cell CELL2 and more particularly the second face FAR of the second photovoltaic cell CELL2.

The interconnection element INTR is beneficially mechanically (and in an embodiment electrically) connected to each of the portions to be connected of the first plurality of portions to be connected. The interconnection element INTR is also beneficially mechanically (and in an embodiment electrically) connected to the second face FAR of the second cell CELL2.

In particular, the first surface S1 of the first portion P1 of the interconnection element INTR is connected to a first portion PAD1 to be connected, for example the portion closest to the first edge EDG1. The second surface S2 of the second portion P2 of the interconnection element INTR is connected to a second portion PAD2 to be connected, for example the portion closest to the second edge EDG2. The interconnection element INTR is therefore connected with a high degree of adhesion at at least two places of the cell, providing a high degree of robustness. Indeed, the tensile force exerted on the interconnection element INTR is generally perpendicular to the plane of the string. Since the interconnection element INTR according to an aspect of the invention offers planar surfaces S1, S2 having large contact areas, the mechanical connection is improved and the risk of tearing reduced.

The element INTR can moreover be connected in the vicinity of each of the first and second edges EDG1, EDG2 by means of the first and second planar surfaces S1, S2. Tearing of an interconnection element on a photovoltaic cell always occurs at an edge because, on the one hand, it is where the stresses are concentrated upon cooling the elements (cell and/or interconnection element) and, on the other hand, it is where the tearing stresses are exerted upon manipulating the strings.

The third portion P3 of the element INTR extends over the remainder of the portions to be connected and is, in an embodiment, connected to each of these portions.

In the case where a plurality of interconnection elements INTR interconnect the first and second cells CELL1, CELL2 to each other, each interconnection element INTR extends over a distinct plurality of portions to be connected and in the manner previously described. That is, the first surface S1 of each element INTR is connected to one of the portions to be connected, for example the one closest to the first edge EDG1. The second surface S2 of each element INTR is connected to another of the portions to be connected, for example the one closest to the second edge EDG2.

The two portions to which the interconnection element INTR is connected, and in an embodiment all the portions of the first plurality of portions to be connected, may have a free and/or metallized surface. In the case of a free surface, the portion may comprise a surface of transparent conductive oxide (TOO). Although these portions do not provide good electrical contact, they can nevertheless offer good mechanical contact. Some adhesives, for example epoxy-based adhesives, adhere well to non-metallized surfaces and in particular to transparent conductive oxides.

The portions to be connected may comprise a free part and a metallized part. The metallized part is, for example, a metal track such as a busbar or a metal pad or even a collection electrode. Metallized surfaces enable electrical contact to be established. Thus, employing an electrically conductive adhesive, comprising for example metal particles in epoxy or acrylate, enables mechanical and electrical contact to be made with the metallized part and mechanical contact to be made with the free part.

A metallized surface may be of interest in making a weld connection of the interconnection element INTR, either by means of a conductive filler alloy or by virtue of a fusible alloy coating of the interconnection element INTR.

When adhesion of the interconnection element INTR to the portions to be connected is achieved by means of an electrically conductive adhesive, the thickness of the adhesive paste may be reduced, for example to less than 70 μm. A thickness of less than 40 μm can also be contemplated. Indeed, the adhesion of a wired interconnection element (that is solely cylindrical) requires thick portions of adhesive, to be able to increase the surface area in contact with the wired element. The planar surfaces S1, S2 of the interconnection element INTR do not, on the contrary, require thick adhesive portions, in order to adhere over a large surface area.

The width of the adhesive, measured along direction Z2, can also be modulated according to whether it is used to connect one of the planar surfaces S1, S2 or part of the third portion P3. For example, the adhesive has a width of 600 μm and 800 μm to connect the planar surfaces S1, S2. It may have a width between 400 μm and 600 μm to connect the third portion P3.

The second face FAR of the second cell CELL2 may also have a second plurality of portions to be connected. These are distributed between the third edge EDG3 and the fourth edge EDG4, for example along the fifth direction Y2. The interconnection element INTR then beneficially extends over the second face and over each portion to be connected of the second plurality of portions to be connected. Beneficially, the third surface S3 of the fourth portion P4 of the interconnection element INTR is connected to a portion to be connected and for example the one closest to the fourth edge EDG4. The fourth surface S4 of the fifth portion P5 of the interconnection element INTR is beneficially connected to another portion to be connected, for example the one closest to the third edge EDG3. In this way, the mechanical and/or electrical connection to the second cell CELL2 is also improved.

Unlike in FIG. 21, the interconnection element INTR of FIG. 22 has a bend between the second edge EDG2 and the third edge EDG3 so as to change plane. Thus, the first and second cells CELL1, CELL2 can be arranged in a same plane.

FIG. 23 schematically illustrates a mode of implementation of the method FABSTR for manufacturing a photovoltaic string STR, as illustrated in FIG. 21 and FIG. 22. The method FABSTR firstly comprises a step of providing FS1 first and second photovoltaic cells CELL1, CELL2 as previously described. The two photovoltaic cells are disposed parallel to a plane, or even in a same plane (to produce the string STR of FIG. 22).

The method FABSTR also comprises a step FS2 of interconnecting the second cell CELL2 to the first cell CELL1, by means of at least one interconnection element INTR as previously described. Each interconnection element is connected to the first face FAV of the first cell CELL1 so that it extends, along the fifth direction Y2, over the first plurality of portions to be connected and beyond the second edge EDG2, up to the second cell CELL2. The first surface S1 of the first portion P1 of each interconnection element INTR is connected to one of the portions to be connected closest to the first edge EDG1, and the second surface S2 of the second portion P2 of each interconnection element INTR is connected to one of the portions to be connected closest to the second edge EDG2.

Beneficially, when the connection is made by adhesive bonding, the interconnection step FS2 comprises a step FS21 of depositing a portion of conductive adhesive paste onto each of the portions to be connected. It then comprises a step FS22 of pressing the first surface S1 of the first portion P1 of each interconnection element INTR. Beneficially, pressing FS22 is also carried out on the second planar surface S2 of each interconnection element INTR. The pressing step FS22 beneficially also applies in the same way to the third and fourth planar surfaces S3, S4 of each interconnection element INTR.

Regardless of whether the connection is made by bonding or welding, the manufacturing method FABSTR in an embodiment comprises, after interconnecting FS2, a complementary step FS3 of heat treating at least the first photovoltaic cell CELL1 and each interconnection element INTR. Thus, when the interconnection is made by bonding, the adhesive is cross-linked. When the interconnection is made by welding, the conductive alloy (whether a filler alloy or a fusible alloy coating surrounding the interconnection element) fuses, wets the elements to be welded, and then solidifies upon cooling resulting in a weld which connects the metal (or metallized) elements.

For both types of interconnections: bonding and welding, a mechanical pressure is beneficially exerted at each of the first and second portions P1, P2 of each interconnection element INTR, during the treatment step FS3. The pressure force is applied so as to press the portions against the photovoltaic cell, in this case, along the direction opposite to the fourth direction X2 (in other words, opposite to the direction of the first face FAV). In this way, the first and second surfaces S1, S2 are maintained in contact with the first face FAV of the first cell CELL1 for the bonding or welding time. Any irregularities in the interconnection element INTR (such as misalignment of the planar surfaces S1, S2 with a generatrix of the third portion P3) are compensated for, enabling the element INTR to be correctly bonded/welded to each portion to be connected. The pressure exerted is for example greater than 1 N/mm². It may be noted that the pressure exerted may form a slight indentation mark on the interconnection element INTR during heat treatment. The indentation is disposed at the first and second portions P1, P2 and is opposite to the first and second surfaces S1, S2.

FIG. 24 schematically illustrates a piece of equipment EQ for manufacturing a photovoltaic string STR as previously described. The equipment EQ comprises a photovoltaic cell manipulator M1. This is, for example, a conveyor or an equipped manipulator arm. The cell manipulator is especially configured to arrange the cells CELL1, CELL2 in a plane, the first face FAV of the first cell CELL1 being oriented along X2.

The equipment EQ also comprises an interconnection element manipulator M2. This manipulator is configured to deposit each interconnection element INTR onto the portions to be connected of the first cell CELL1. The interconnection element manipulator M2 is particular in that it enables the interconnection elements to be aligned with the different orientations and portions to be connected PAD1, PAD2. The manipulator M2 comprises, for example, an alignment system, such as an optical ruler, to dispose onto the first and second planar surfaces S1, S2 the first and second portions PAD1, PAD2 to be connected.

The equipment EQ moreover comprises a connection system M3 configured to connect the interconnection element INTR to the portions to be connected. For this, it may comprise a dispenser of electrically conductive adhesive or welding paste, for placing adhesive or welding paste on the portions to be connected. The connection system M3 may also comprise a heat treatment device, such as an oven, kiln or heating lamp, for cross-linking the adhesive or vitrifying the welding paste.

Beneficially, the equipment EQ comprises a device DISP for manufacturing an interconnection element. In this way, each interconnection element INTR can be shaped, from a cylindrical conductor wire, just prior to its interconnection to the first cell CELL1.

It will be appreciated that the various embodiments described previously are combinable according to any technically permissible combinations.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The invention claimed is:

1. An interconnection element extending along a first direction, said interconnection element comprising:
    first and second ends opposite to each other, and
    first, second and third portions extending between the first and second ends,
        the first portion having a first planar surface oriented along a second direction perpendicular to the first direction, the first planar surface being parallel to a plane comprising the first direction, the first planar surface being perpendicular to the second direction
        the second portion, distant from the first portion and from the second end the second portion having a second planar surface oriented along the second direction, the second planar surface being parallel to a plane comprising the first direction, the second planar surface being perpendicular to the second direction, and
        the third portion, between the first portion and the second portion, and having a circular cross-section in a plane perpendicular to the first direction.

2. The interconnection element according to claim 1, wherein the first portion extends from the first end.

3. The interconnection element according to claim 1, wherein the first portion is distant from the first end.

4. The interconnection element according to claim 1, wherein a cross-section of the first portion comprises an arc of a circle, at least one line segment and two curve segments, said at least one line segment being parallel to a third direction perpendicular to the first and second directions, the two curve segments joining the arc of a circle and said at least one line segment, the area of said cross-section of the first portion being equal to the area of the circular cross-section of the third portion.

5. The interconnection element according to claim 1, wherein the first and second planar surfaces are tangent to the third portion.

6. The interconnection element according to claim 1, wherein the circular cross-section of the third portion has a diameter D, the first planar surface having a first width measured along a third direction perpendicular to the first and second directions, said first width being greater than 0.6×D.

7. The interconnection element according to claim 1, wherein the first portion has a first length, measured along the first direction, of between 4 mm and 16 mm.

8. The interconnection element according to claim 7, wherein the first portion has a first length, measured along the first direction, of between 6 mm and 10 mm.

9. The interconnection element according to claim 1, further comprising:
fourth, fifth and sixth portions extending between the first and second ends,
the fourth portion having a third planar surface, oriented along a direction opposite to the second direction,
the fifth portion, distant from the fourth portion and from the first end, the fifth portion having a fourth planar surface oriented along the direction opposite to the second direction, and
the sixth portion, between the fourth portion and the fifth portion, and having a circular cross-section.

10. The interconnection element according to claim 9, wherein the fourth portion extends from the second end.

11. The interconnection element according to claim 9, wherein the fourth portion is distant from the second end.

12. The interconnection element according to claim 9, wherein the second portion and the fourth portion are at least partially the same.

13. The interconnection element according to claim 9, wherein the second portion and the fifth portion are distant from each other.

14. A photovoltaic string comprising first and second photovoltaic cells, the second photovoltaic cell being electrically connected to the first photovoltaic cell, the first and second photovoltaic cells being parallel to a plane, the first photovoltaic cell comprising:
first and second edges opposite to each other,
a first face, oriented along a fourth direction perpendicular to said plane, said first face comprising a first plurality of portions to be connected to an interconnection element, the first plurality of portions to be connected being distributed between the first edge and the second edge along a fifth direction perpendicular to the fourth direction,
the photovoltaic string comprising at least one interconnection element according to claim 1, partly extending over the first face and over the first plurality of portions to be connected, said at least one interconnection element extending, along the fifth direction, beyond the second edge so as to reach the second photovoltaic cell, the first planar surface of the first portion of said at least one interconnection element being connected to a first portion of the first plurality of portions to be connected, the second planar surface of the second portion of said at least one interconnection element being connected to a second portion of the first plurality of portions to be connected.

15. The photovoltaic string according to claim 14, wherein the first portion to be connected is the portion of the first plurality of portions to be connected closest to the first edge and wherein the second portion to be connected is the portion of the first plurality of portions to be connected closest to the second edge.

16. The photovoltaic string according to claim 14, further comprising conductive adhesive paste adhering to each of the first and second portions of the first plurality of portions to be connected and to said at least one interconnection element, a thickness of said conductive adhesive paste being less than 70 μm.

17. The photovoltaic string according to claim 14, further comprising a conductive alloy welded to each of the first and second portions of the first plurality of portions to be connected and to said at least one interconnection element.

18. The photovoltaic string according to claim 14, comprising at least one interconnection element, wherein the second photovoltaic cell comprises:
third and fourth edges opposite to each other, the third edge being parallel to and facing the second edge of the first photovoltaic cell, and
a second face, oriented along a direction opposite to the fourth direction, said second face comprising a second plurality of portions to be connected, distributed between the third edge and the fourth edge along the fifth direction,
said at least one interconnection element wherein the interconnection element further comprises:
fourth, fifth and sixth portions extending between the first and second ends,
the fourth portion having a third planar surface, oriented along a direction opposite to the second direction,
the fifth portion, distant from the fourth portion and from the first end, the fifth portion having a fourth planar surface oriented along the direction opposite to the second direction, and
the sixth portion, between the fourth portion and the fifth portion, and having a circular cross-section,
the interconnection element extending along the fifth direction on the second face and on the second plurality of portions to be connected, the third surface of the fourth portion of said at least one interconnection element being connected to a fourth portion to be connected of the second plurality of portions to be connected, the fourth surface of the fifth portion of said at least one interconnection element being connected to a third portion to be connected of the second plurality of portions to be connected.

* * * * *